(12) United States Patent
Kamins et al.

(10) Patent No.: US 7,691,201 B2
(45) Date of Patent: Apr. 6, 2010

(54) METHOD OF FORMING THREE-DIMENSIONAL NANOCRYSTAL ARRAY

(75) Inventors: Theodore I. Kamins, Palo Alto, CA (US); Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 987 days.

(21) Appl. No.: 10/690,688

(22) Filed: Oct. 21, 2003

(65) Prior Publication Data

US 2004/0079278 A1   Apr. 29, 2004

Related U.S. Application Data

(63) Continuation-in-part of application No. 10/281,678, filed on Oct. 28, 2002, now Pat. No. 7,378,347.

(51) Int. Cl.
*C30B 21/02* (2006.01)
(52) U.S. Cl. .............................. 117/84; 117/37; 117/87; 117/90; 117/95
(58) Field of Classification Search .................. 117/37, 117/84, 87, 90, 95
See application file for complete search history.

(56) References Cited

U.S. PATENT DOCUMENTS

| 6,294,450 | B1 * | 9/2001 | Chen et al. | 438/597 |
| 6,831,017 | B1 * | 12/2004 | Li et al. | 438/694 |
| 2004/0137214 | A1 * | 7/2004 | Chen et al. | 428/323 |

OTHER PUBLICATIONS

Wwestwater et al, "Growth of silicon nanowires via gold/silane vapor-liquid-solid reaction", Journal of Vacuum Science and Technology vol. 15(3) May/Jun. 1997 pp. 554-557.*
Gudlksen, Mark S., et al., "Growth of Nanowire Superlattice Structures for Nanoscale Photonics and Electronics," Letters to Nature, Nature, vol. 415, Feb. 7, 2002, pp. 617-620.
Bjork, M. T., et al., "One-dimensional Steeplechase for Electrons Realized," Nano Letters, vol. 2, No. 2, pp. 87-89, American Chemical Society. Published on the Web on Jan. 19, 2002.

* cited by examiner

*Primary Examiner*—Robert M Kunemund

(57) ABSTRACT

A method of forming an assembly of isolated nanowires of at least one material within a matrix of another material is provided. The method comprises: providing a substrate; forming a catalyst array on a major surface of the substrate; growing an array of the nanowires corresponding with the catalyst array, the nanowires, each comprising at least one material; and forming a matrix of another material that fills in spaces between the nanowires. The method is useful for producing a variety of structures useful in a number of devices, such as photonic bandgap structures and quantum dot structures.

19 Claims, 3 Drawing Sheets

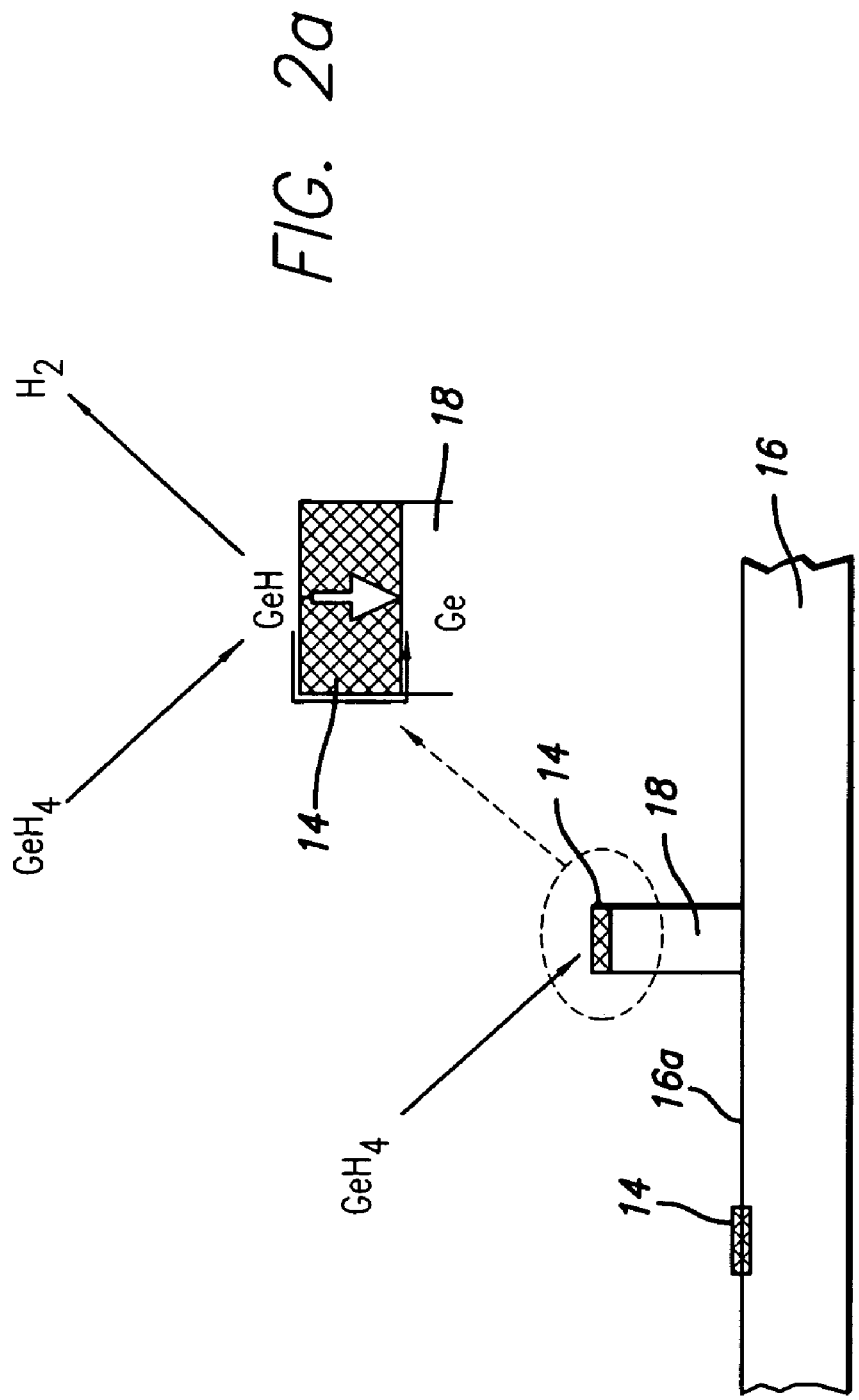

METHOD OF FORMING THREE-DIMENSIONAL NANOCRYSTAL ARRAY

CROSS-REFERENCE TO RELATED APPLICATIONS

The present application is a continuation-in-part application of application Ser. No. 10/281,678, filed Oct. 28, 2002 now U.S. Pat. No. 7,378,347, entitled "A Method of Forming Catalyst Nanoparticles for Nanowire Growth and Other Applications", filed in the names of Theodore I. Kamins et al and assigned to the same assignee as the present application. That application is directed to the growth of silicon nanowires for forming arrays of such nanowires having a large surface-to-volume ratio. The techniques disclosed therein are employed in the practice of the present embodiments.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. MDA972-01-3-0005 awarded by the Defense Advanced Research Projects Agency.

TECHNICAL FIELD

The present invention is directed to the fabrication of a plurality of single-material or segmented nanowires embedded in a matrix.

BACKGROUND ART

Bulk synthesis of semiconductor wires has been traditionally achieved using several variations of metal catalyzed techniques, such as vapor-liquid-solid (VLS) synthesis. In conventional metal-catalyzed nanowire synthesis techniques used for producing semiconductor (e.g., silicon) nanowires, each wire grows from a single particle of gold, cobalt, nickel, or other metal. A vapor-phase silicon-containing species transported to the catalyst inside a high-temperature furnace reacts on the surface of the catalyst, is transported, and precipitates to form silicon nanowires. In the VLS technique, the catalyst nanoparticles are in the liquid form; in analogy to the VLS process, nanowires can be grown using metal catalyst nanoparticles that remain in the solid state during nanowire growth.

Silicon nanowires produced by the conventional VLS and related processes are composed of a single crystal. In the conventional process, the size of the catalytic particle controls the diameter of the nanowire grown from it. Thus, in order to obtain a uniform nanowire diameter distribution, monodispersed catalyst particles need to be created on a solid substrate. However, creation of nanometer-size catalyst particles is a non-trivial task. The nanoparticles can be formed by deposition techniques, such as chemical vapor deposition (CVD) or physical vapor deposition (PVD). Although they can be registered to previously formed patterns, creating these patterns requires additional processing, usually involving costly lithography. In addition, conventional lithography processes cannot readily form nanoparticles of the desired small dimensions.

The above-referenced application Ser. No. 10/281,678 provides a solution to the foregoing problem. A variety of embodiments are disclosed and claimed. In one embodiment, the formation of an ordered array of catalyst nanoparticles is achieved by imprinting, generally using two steps of imprinting at an angle, e.g., orthogonal, to each other. The pattern of nanocrystals is then used to catalyze the growth of nanowires, starting at the position of the nanoparticles.

The foregoing application describes methods for forming nanowires comprising a single material, such as Si or Ge. However, other researchers have shown that the composition of the nanowires can be changed during growth so that different materials are at different positions along the length of the nanowire.

There is a need to provide a method for forming solid arrays of nanowires, comprising alternating regions of different compositions. Such arrays would find use in a variety of applications, including, but not limited to, quantum dots and photonic bandgap crystals.

DISCLOSURE OF INVENTION

In accordance with the embodiments disclosed herein, a method of forming an assembly of isolated nanowires of at least one material within a matrix of another material is provided. The method comprises:
  providing a substrate;
  forming a catalyst array on a major surface of the substrate;
  growing an array of the nanowires corresponding with the catalyst array, the nanowires each comprising at least one material; and
  forming a matrix of another material that fills in spaces between the nanowires.

In accordance with another embodiment, a method of forming an assembly of segmented nanowires of two materials within a matrix of one of the two materials is provided. The method comprises:
  providing a substrate;
  forming a catalyst array on a major surface of the substrate;
  growing an array of the nanowires corresponding with the catalyst array, the nanowires each comprising alternating regions of the two materials; and
  forming a matrix of one of the materials that fills in spaces between the nanowires.

Further in accordance with another embodiment, an assembly of isolated nanowires or segments of nanowires of one or two materials within a matrix of another material is provided.

Still further in accordance with yet another embodiment, a photonic bandgap structure is provided comprising an assembly of isolated segments of a first material within a matrix of a second material.

Yet further in accordance with another embodiment, a quantum dot structure is provided, comprising an array of controllably placed isolated segments of one material surrounded on top and bottom by a second material and on the sides by a matrix of another material, which may be the same as the second material or another material other than the first material. The dimensions of the isolated segments are small enough to provide quantum confinement.

BRIEF DESCRIPTION OF THE DRAWINGS

FIG. 2 depicts the formation of semiconductor nanowires on a substrate;

FIG. 2a is an enlargement of a portion of FIG. 2; and

BEST MODES FOR CARRYING OUT THE INVENTION

Reference is made now in detail to specific embodiments, which illustrate the best modes presently contemplated by the inventors. Alternative embodiments are also briefly described as applicable.

In accordance with the teachings herein, the composition of nanowires can be changed during growth so that different materials are at different positions along the length of the nanowire. This permits forming alternating regions of Si and Ge. If the nanowires are in an ordered array, for example, nucleated by the array formed by the method of the above-referenced patent application, then a three-dimensional array of nanocrystals can be formed by varying the composition of each wire in the array along its length. For the example of Si and Ge, three-dimensional nanocrystalline arrays of Si and of Ge may be formed, with the elements of each array bounded on top and bottom by the other element and the sides bounded by the gap between the nanowires.

In accordance with one embodiment of the teachings herein, a method of forming an assembly of isolated nanowires of at least one material within a matrix of another material is provided. The method comprises:

providing a substrate;

forming a catalyst array on a major surface of the substrate, growing an array of the nanowires corresponding with the catalyst array, the nanowires each comprising at least one material; and forming a matrix of another material that fills in spaces between the nanowires.

As a consequence, an assembly of isolated nanowires or segments of nanowires of one or two materials within a matrix of another material is formed.

Figure 1A:
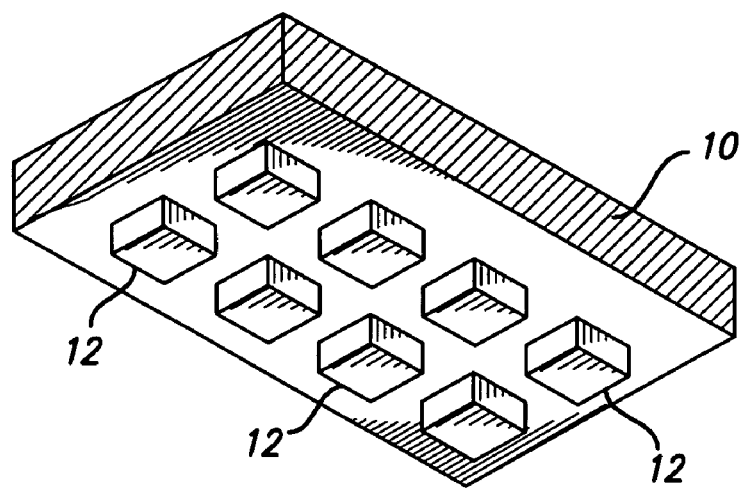
FIGS. 1a-1c illustrate one embodiment of the sequence of steps for transferring a catalyst to a substrate using a mold.
Figure 1B:
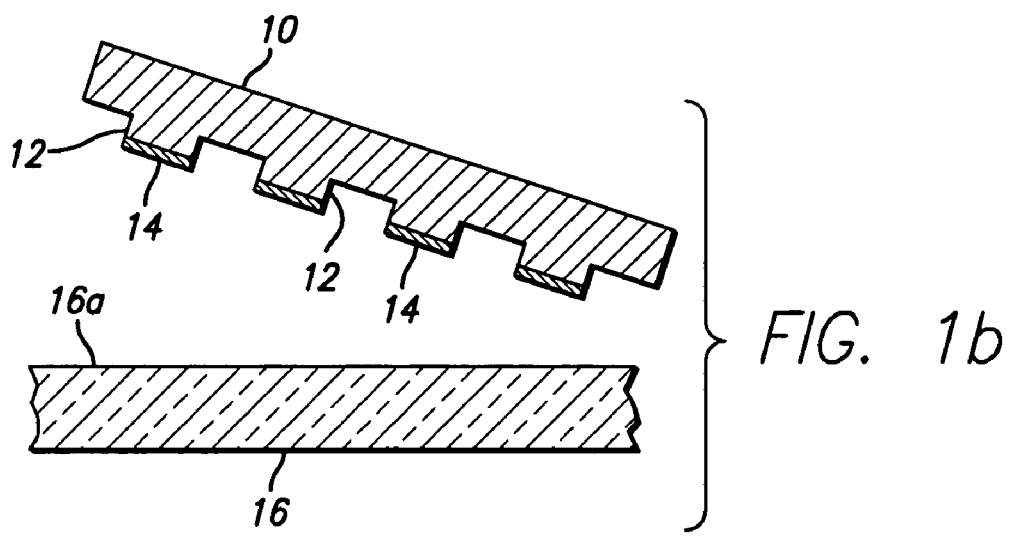
Figure 1C:
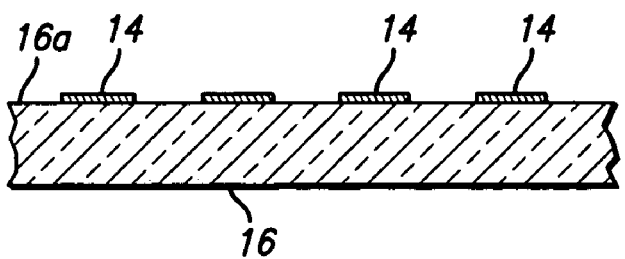

FIGS. 1a-1c depict one embodiment for forming a catalyst array on a major surface of a substrate. That sequence of process steps is based on above-referenced application Ser. No. 10/281,678. The mold typically contains an array of protruding and/or recessed regions having nanoscale dimensions (e.g., less than about 500 nm). As shown in FIG. 1a, a mold 10 is provided, with nanoscale protrusions 12 forming all the individual elements of the desired pattern. A suitable mold 10 for use in nanoimprint lithography is disclosed in U.S. Pat. Nos. 5,772,905 and 6,309,580, both incorporated herein by reference.

The mold 10 can be patterned with protruding features 12, such as pillars, stripes, rectangular solids, or other three-dimensional designs. Protruding features 12 having a minimum lateral size of 25 nm can be obtained using electron beam (e-beam) lithography, reactive ion etching (RIE), and other appropriate technology. Preferably, protruding features 12 of the mold 10 will have a lateral dimension within the range of about 5 to 20 nm. A mold 10 having the desired pattern of protruding nanoscale features 12 at resolution levels much less than that of the state-of-the-art e-beam lithography can be made according to the methods disclosed in the above-referenced application Ser. No. 10/281,678 or as disclosed in application Ser. No. 10/642,371, filed on Aug. 15, 2003 and entitled "Imprinting Nanoscale Patterns for Catalysis and Fuel Cells" and filed in the names of Yong Chen et al, incorporated herein by reference. The typical depth of a protruding feature 12 is within the range of about 5 to 500 nm.

As shown in FIGS. 1b and 1c, the protrusions 12 of mold 10 are coated with a material containing the desired catalyst, and the catalytic material 14 is then transferred to a substrate 16 having as one of its major surfaces 16a a non-catalytic surface by physical contact, or possibly by an energetic or chemical attraction between the catalytic material and the surface of the substrate when they are brought together.

The foregoing description has been presented in terms of a one-step transfer of catalyst. Alternatively, a two-step process, also disclosed in application Ser. No. 10/281,678, can be used to form the catalyst regions. The two-step process includes depositing an unpatterned region of catalyzing material on a substrate, imprinting a line into an overlying etch-resistant material, etching to remove the catalyst material where not protected, then imprinting a second line orthogonal to the first and again etching, so that the catalyst only remains where protected by both imprints. For the two-step process, the mold should comprise a relatively hard material capable of retaining its shape and integrity under the pressure applied during a nanoimprinting process. Accordingly, the mold can be made of materials such as metals, dielectrics, semiconductors, ceramics, or their combination. By using either the one-step process or two-step process, nanoscale regions of the catalyst material are formed on the substrate.

In general, the catalytic material 14 includes a catalyst capable of catalyzing the growth of nanowires. Accordingly, the catalytic material 14 can include metals used to generate silicon nanowires, such as, but not limited to, titanium, gold, platinum, palladium, nickel and manganese. To generate germanium nanowires, the catalytic material 14 can be, but is not limited to, gold. Nanowires of other semiconductor materials can also be grown by catalyzed growth. The catalyst for the growth of such semiconductor materials is, in many cases, known in the art.

In this embodiment, the substrate 16 may comprise any material having a non-catalytic surface 16a capable of accepting the catalytic nanoparticles transferred from the mold 10; examples include, but are not limited to, silicon, silicon dioxide (silica), silicon nitride, and aluminum oxide (alumina).

FIG. 2 depicts an example of metal-catalyzed nanowire growth. On the major surface 16a of substrate 16 is formed a metal catalyst nanoparticle 14, as described above. In this example, the substrate 16 comprises silicon and the metal catalyst nanoparticles 14 comprise gold. In this example, it is desired to grow germanium (Ge) nanowires 18. This is done by introducing a gaseous source containing Ge, such as germane ($GeH_4$). The germane molecules react with the gold nanoparticles 14, forming Ge atoms by catalyzed surface reaction and releasing $H_2$; the Ge atoms diffuse through or around the gold nanoparticles 14 to the substrate where they precipitate, thereby forming the nanowires 18. The details of the process are depicted in FIG. 2a. Alternatively, the Ge atoms can be provided by physical deposition techniques, such as laser ablation, followed by adsorption and surface diffusion.

While the foregoing describes the formation of nanowires 18 of one composition, it will be readily appreciated that by introducing one gas, e.g., germane, for a period of time and then switching to a second gas, e.g., silane ($SiH_4$) for a period of time and then switching back, it is possible to grow nanowires having alternating regions of the two compositions, Ge and Si. Alternatively, physical vapor deposition, or a combination of physical and chemical vapor deposition, can be used to grow the nanowires.

Figure 3A:
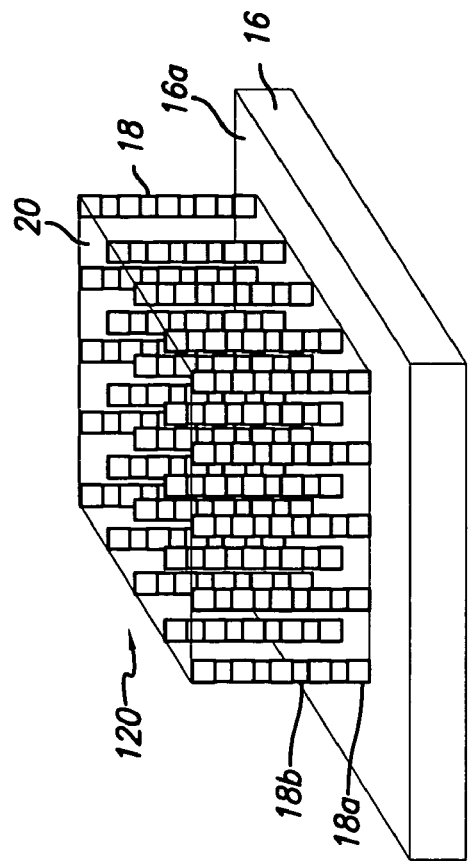
FIGS. 3a-3c illustrate one embodiment of the sequence of steps for forming three-dimensional segmented nanowires embedded in another material.
Figure 3B:
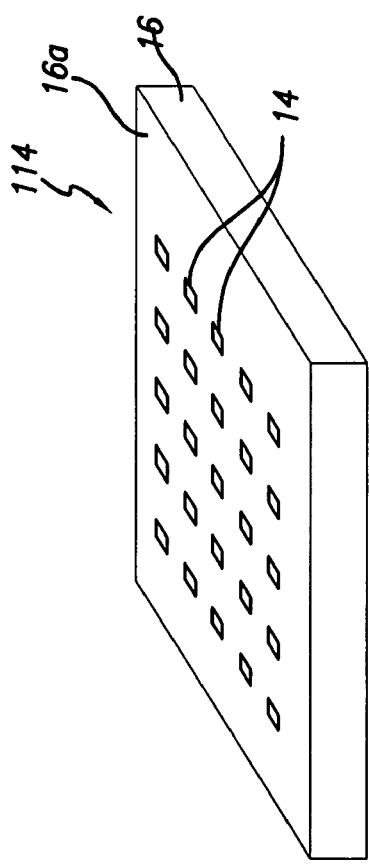
Figure 3C:
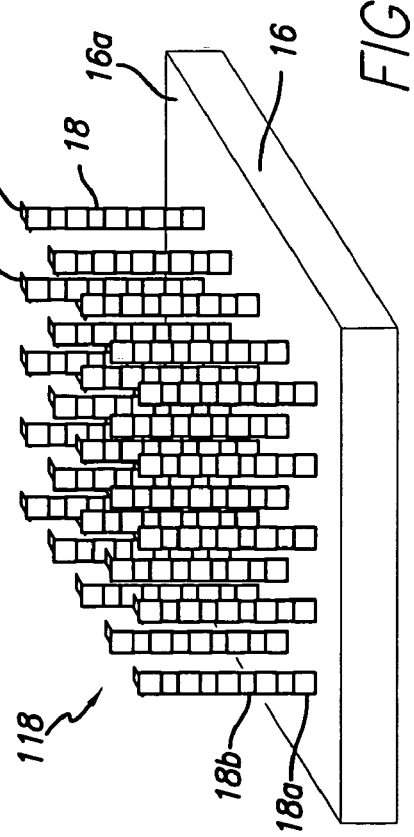

FIGS. 3a-3c depict the sequence of events of forming nanowires 18 of alternating Ge 18a and Si 18b segments. As shown in FIG. 3a, a catalyst array 114, comprising a plurality of catalyst nanoparticles 14, is formed on a surface 16a of substrate 16, such as by employing the techniques described above.

In FIG. 3b, an array 118 of nanowires 18 is next formed, again employing the techniques described above. Although this Figure is presented in terms of two specific materials, Ge and Si, it will be readily apparent that any two materials that can be grown by metal catalysis of vapors containing the two materials can similarly be formed. The nanowires 18 comprise alternating regions of the two materials, here, Ge and Si.

It is clear that it is advantageous to employ a single catalyst 14 for the growth of the two materials. Here, gold serves to catalyze the growth of Ge 18a from germane and of Si 18b from silane.

The space between the nanowires 18 is filled with a third, matrix material 20, as shown in FIG. 3c. This third, matrix material 20 may be the same as one of the two materials comprising the nanowires 18 or may be a different material.

The matrix 20 may comprise a single layer of material or two or more layers of materials. In either case, the material in the layer(s) may be selected based on its optical and/or electrical properties, such as, but not limited to, index of refraction, electrical permittivity, and magnetic permeability. For example, it may be advantageous to employ one or more layers that have either a lesser or a greater index of refraction than the material(s) comprising the nanowires 18. Such configurations would be useful in waveguiding applications, as well as in photonic crystal applications. For the case where two or more layers are employed, each such layer may either be aligned with a segment of the nanowires 18 and of approximately the same thickness or not.

In addition to the materials listed above, where the material(s) comprising the matrix 20 are selected on the basis of their optical and/or electrical properties, such materials may comprise oxides, nitrides, oxynitrides, and polymers capable of filling spaces between nanowires and then developing high mechanical rigidity and, for selected applications, having suitable electrical or optical properties. Specific examples include silicon dioxide, silicon nitride, silicon oxynitride, aluminum oxide, and polydimethylsiloxane (PDMS) (e.g., Sylgard 184, a tradename of PDMS available from Dow Corning). $SiO_2$ is a preferred material, because it is reasonably transparent to UV and therefore useful for photonic band gap applications.

In one embodiment, the nanowires 18 comprise alternating regions of Ge 18a and Si 18b and the matrix material 20 comprises Si. Preferably, in this embodiment, the substrate 16 is also silicon, so that in the ideal case, the substrate, matrix 20, and segments 18b of the nanowires 18 are all single-crystal silicon, with essentially no boundaries therebetween. In this fashion, three-dimensional nanocrystals of one material (e.g., Ge 18a) are formed within a second material (e.g., Si 18b, 20) to thereby comprise an assembly 120. Such an assembly 120 is useful, for example, as a photonic bandgap structure.

Returning to the first embodiment above, it will be readily appreciated that the nanowires may simply comprise a first composition and the matrix material 20 a second composition, different than the first composition. Specifically photonic bandgap structures comprise a regular array in two or three dimensions of isolated segments of the first material having a first index of refraction within a matrix of the second material having a second and distinct index of refraction, wherein the isolated segments have a diameter within a range of about 10 to less than 500 nm.

Examples of photonic bandgap materials are increasingly well-known and have a growing variety of applications. Examples of such applications include light channeling in sub-micron channels, including the ability to turn light at right angles in the channel, beam splitters, optically resonant cavities, and optical couplers.

Turning now to another embodiment, when the dimensions of the nanocrystals (defined by the nanowire diameter and the segment length) are smaller than a critical dimension, the energy levels associated with allowed states deviate from those in the bulk. For Si or Ge, this critical dimension is of the order of 10 nm or less at room temperature. A three-dimensional structure with all dimensions less than the critical dimension is commonly called a "quantum dot". Thus, small catalyst nanoparticles (leading to narrow diameter nanowires) and short isolated segments can create quantum dots. Thus, the isolated segments are controllably placed in all three dimensions.

The quantum dot structure accordingly comprises nanowires 18 comprising isolated segments of a first material 18a, e.g., Ge, surrounded on top and bottom by a second material 18b, e.g., Si, and on the sides by a matrix 20 of a third material. The third material may be the same as the second material or may be another material other than the first material. The dimensions of the isolated segments 18a are small enough to provide quantum confinement. As an example, quantum confinement in Si and Ge may be achieved where the dimensions are of the order of 10 nm or less.

The ability to controllably place quantum dots in all three dimensions permits the fabrication of not only isolated artificial atoms (each artificial atom comprising a quantum dot with discrete energy levels, controlled by tailoring the size of the dot), but, by closer placement, artificial molecules (each artificial molecule comprising two or more quantum dots within quantum mechanical tunneling distance of each other), thus allowing a new and complex set of discrete energy levels not available from a single quantum dot.

For practical applications, the nanowires 18 would need to have diameters large enough (relative to their length) to be reasonably rigid and maintain the spacing within the array 118. The relation between the diameter and length depends on the stiffness of the materials forming the nanowire. For typical materials, a diameter greater than 5% of the nanowire length should provide adequate stability for most applications. For selected applications, additional rigidity would be needed, and this can be obtained by restricting the length/diameter ratio further.

The array 118 of nanowires is made more robust and better defined by the additional step of depositing material 20 to fill the gaps between the nanowires 18. Optical and electrical properties are also changed by filling the gaps with another material. The index of refraction, bandgap, and band alignment will differ from those of air, modifying the optical and electrical properties of the array. The formation of the material 20 is preferably performed using non-catalytic deposition; any of the conventional deposition techniques known in the art may be employed, such as CVD, which is the same technique used for growing the Ge and Si segments. CVD is a preferred choice, since both Ge and Si are easily deposited from the gaseous compounds $GeH_4$ and $SiH_4$, respectively. The segments 18a, 18b are grown by simply controlling the gas flow of one or the other of the foregoing gaseous compounds. Once the nanowires 18 are fully grown, then the spaces between them are filled, also using CVD.

Alternate embodiments of forming the matrix 20 include, but are not limited to, directional filling using physical vapor deposition (PVD) or high-density plasma-enhanced chemical vapor deposition (HDP-CVD).

The nanowire growth can be terminated by removing the catalyzing nanoparticle at the tip of the wire; e.g., by polishing (such as using a sacrificial material to provide mechanical rigidity during the polishing step). Alternatively, the deposition conditions can be changed so that catalytic growth is no longer favored over normal growth. In concept, a catalyst material can be chosen such that it is catalytically active for the materials in the nanowire 18, but not for the material in the matrix 20.

While a variety of semiconductor materials may be formed, including, but not limited to, group IV semiconductors (e.g., Si, Ge), III-V compound semiconductors (e.g., GaAs, GaP, InAs, InP, and other III-V compound semiconductors) and their alloys, and II-VI compound semiconductors (e.g., CdS, CdTe, and other II-VI compound semiconductors) and their alloys, a preferred embodiment employs the growth of Si and Ge segments in forming the nanowires 18.

In forming Ge nanowires 18 (or segments 18a) using Au catalytic nanoparticles, the liquid eutectic of the Au—Ge system is 361° C. The temperature range at which growth of such nanowires 18 (or segments 18a) can take place has been found to be at a temperature greater than 310° C., but less than 380° C. Specifically, the growth temperature is within the range of about 315° to 370° C. under one set of deposition variables; the minimum temperature can be reduced (perhaps by 50° C.) by using other equipment and deposition variables. Under the foregoing growth conditions, a Ge nanowire diameter of about 40 nm is obtained, using Au nanoparticles of about 20 nm.

Similar results are obtained at higher temperatures (typically up to 600° C.) for the growth of Si using Au nanoparticles in conjunction with $SiH_4$. The use of $Si_2H_6$ may reduce the process temperature moderately.

Specifically included herein is the embodiment wherein one material is formed from one gaseous source and the second material is formed from a combination of both gaseous sources. For example, Si and $Si_{(1-x)}Ge_{(x)}$ segments may be formed using $SiH_4$ for both segments, with $GeH_4$ only being used during deposition of the second material.

INDUSTRIAL APPLICABILITY

The growth of single composition and double composition nanowires, embedded in a matrix, is expected to find use in a variety of nanoscale applications, including, but not limited to, photonic bandgap structures and quantum dot structures.

What is claimed is:

1. A method of controllably forming a three-dimensional assembly of isolated nanowires, each nanowire comprising at least two materials within a matrix of an other material, said method comprising:
   providing a substrate;
   forming a two-dimensional catalyst array on a major surface of said substrate, wherein said step of forming said catalyst array comprises:
      providing a mold with nanoscale protrusions forming all the individual elements of a desired pattern;
      coating said protrusions with a material containing said catalyst;
      providing a substrate; and
      transferring said catalyst to a major surface of said substrate, said major surface comprising a non-catalytic surface, to form a pattern of said catalyst on said major surface of said substrate;
   controllably growing in a third dimension an array of said nanowires corresponding with said catalyst array, said nanowires each comprising said at least two materials; and
   forming the matrix of the other material that fills in spaces between said nanowires.

2. The method of claim 1 wherein said isolated nanowires of the at least two materials comprise alternating regions of a first material and a second material, and wherein said matrix comprises a third material.

3. The method of claim 1 wherein said first material is selected from the group consisting of silicon, germanium, GaAs, GaP, InAs, InP, mixed III-V compound semiconductor materials, CdS, CdTe, and mixed II-VI compound semiconductor materials, wherein said second material is selected from the group consisting of silicon, germanium, GaAs, GaP, InAs, InP, mixed III-V compound semiconductor materials, CdS, CdTe, and mixed II-VI compound semiconductor materials, and wherein said first material is different than said second material.

4. The method of claim 1 wherein said third material is selected from the group consisting of silicon, germanium, GaAs, GaP, InAs, InP, mixed III-V compound semiconductor materials, CdS, CdTe, mixed II-VI compound semiconductor materials, oxides, nitrides, and oxynitrides, and wherein said third material may be the same or different than either said first material or said second material.

5. A method of controllably forming a three-dimensional assembly of isolated nanowires, each nanowire comprising at least two materials within a matrix of an other material, said method comprising:
   providing a substrate;
   forming a two-dimensional catalyst array on a major surface of said substrate, wherein said step of forming said catalyst array comprises:
      imprinting a first line of material over a layer of said catalyst material;
      etching to remove catalyst material where not protected;
      imprinting a second line of material orthogonal to said first line; and
      etching to remove catalyst material where not protected, so that said catalyst only remains where protected by both imprints;
   controllably growing in a third dimension an array of said nanowires corresponding with said catalyst array, said nanowires each comprising said at least two materials; and
   forming the matrix of the other material that fills in spaces between said nanowires.

6. The method of claim 5 wherein said step of growing said array of nanowires comprises:
   introducing a gaseous source containing at least one of the at least two materials; and
   allowing said gaseous source to react with said catalyst and diffuse therethrough or therearound, thereby causing precipitation of said at least one of the at least two materials, thereby forming said nanowires.

7. The method of claim 2 wherein two materials are used to form said nanowires having alternating regions of a first material and a second material by:
   introducing a first gaseous source containing said first material;
   allowing said first gaseous source to react with said catalyst and diffuse therethrough, thereby causing precipitation of said first material, thereby forming one segment;
   introducing a second gaseous source containing said second material;

allowing said second gaseous source to react with said catalyst and diffuse therethrough, thereby causing precipitation of said second material, thereby forming a second segment; and alternating said first gaseous source and said second gaseous source to thereby form said nanowire comprising said alternating regions.

8. The method of claim 7 wherein one of said gaseous sources comprises silane and said material precipitated is silicon and wherein another of said gaseous sources comprises germane and said material precipitated is germanium.

9. The method of claim 5 wherein said step of forming said matrix comprises a non-catalytic method.

10. The method of claim 9 wherein said matrix is formed by chemical vapor deposition or by directional filling using physical vapor deposition or by high-density plasma-enhanced chemical vapor deposition.

11. A method of controllably forming a three-dimensional assembly of isolated nanowires of two materials within a matrix of one of said two materials, said method comprising:
providing a substrate;
forming a two-dimensional catalyst array on a major surface of said substrate, wherein said step of forming said catalyst array comprises:
providing a mold with nanoscale protrusions forming all the individual elements of a desired pattern;
coating said protrusions with a material containing said catalyst;
providing a substrate; and
transferring said catalyst to a major surface of said substrate, said major surface comprising a non-catalytic surface, to form a pattern of said catalyst on said major surface of said substrate;
controllably growing in a third dimension an array of said nanowires corresponding with said catalyst array, said nanowires each comprising alternating regions of said two materials; and
forming a matrix of one of said materials that fills in spaces between said nanowires.

12. The method of claim 11 wherein said catalyst array comprises a metal that catalyzes growth of said nanowires from vapors comprising precursors of said two materials.

13. The method of claim 12 wherein said metal comprises gold and wherein said vapors comprise germane and silane, alternately introduced to be catalyzed by said gold to form said alternating regions of germanium and silicon.

14. The method of claim 11 wherein said substrate comprises silicon, said nanowires comprise alternating regions of germanium and silicon, and said matrix comprises silicon.

15. The method of claim 14 wherein said step of growing said array of nanowires comprises:
introducing a first gaseous source containing a first material;
allowing said first gaseous source to react with said catalyst and diffuse therethrough, thereby causing precipitation of said first material, thereby forming one segment;
introducing a second gaseous source containing a second material;
allowing said second gaseous source to react with said catalyst and diffuse therethrough, thereby causing precipitation of said second material, thereby forming a second segment; and
alternating said first gaseous source and said second gaseous source to thereby form said nanowire comprising said alternating regions.

16. The method of claim 15 wherein one of said gaseous sources comprises silane and said material precipitated is silicon and wherein another of said gaseous sources comprises germane and said material precipitated is germanium.

17. The method of claim 14 wherein said step of forming said matrix comprises a non-catalytic method.

18. The method of claim 17 wherein said matrix is formed by chemical vapor deposition or by directional filling using physical vapor deposition or by high density plasma-enhanced chemical vapor deposition.

19. The method of claim 5 wherein two or more layers of said matrix are formed.

* * * * *

UNITED STATES PATENT AND TRADEMARK OFFICE
CERTIFICATE OF CORRECTION

| | |
|---|---|
| PATENT NO. | : 7,691,201 B2 |
| APPLICATION NO. | : 10/690688 |
| DATED | : April 6, 2010 |
| INVENTOR(S) | : Theodore I. Kamins et al. |

It is certified that error appears in the above-identified patent and that said Letters Patent is hereby corrected as shown below:

In column 10, line 11, in Claim 15, delete "claim 14" and insert -- claim 11 --, therefor.

In column 10, line 31, in Claim 17, delete "claim 14" and insert -- claim 11 --, therefor.

Signed and Sealed this

Second Day of November, 2010

David J. Kappos
*Director of the United States Patent and Trademark Office*